United States Patent
Kim et al.

(10) Patent No.: US 9,894,768 B2
(45) Date of Patent: Feb. 13, 2018

(54) MULTILAYER ELECTRONIC COMPONENT, MANUFACTURING METHOD THEREOF, AND BOARD HAVING THE SAME MOUNTED THEREON

(71) Applicant: SAMSUNG ELECTRO-MECHANICS CO., LTD., Suwon (KR)

(72) Inventors: Ic Seob Kim, Suwon (KR); Soo Hwan Son, Suwon (KR); Yu Jin Choi, Suwon (KR); Ho Yoon Kim, Suwon (KR); Myeong Gi Kim, Suwon (KR); So Yeon Song, Suwon (KR); Min Kyoung Cheon, Suwon (KR); Byeong Cheol Moon, Suwon (KR); Young Il Lee, Suwon (KR)

(73) Assignee: SAMSUNG ELECTRO-MECHANICS CO, LTD., Suwon-si, Gyeonggi-Do (KR)

( * ) Notice: Subject to any disclaimer, the term of this patent is extended or adjusted under 35 U.S.C. 154(b) by 31 days.

(21) Appl. No.: 14/289,025

(22) Filed: May 28, 2014

(65) Prior Publication Data
US 2015/0155084 A1    Jun. 4, 2015

(30) Foreign Application Priority Data
Nov. 29, 2013    (KR) .......................... 10-2013-0147905

(51) Int. Cl.
*H01F 5/00*    (2006.01)
*H01F 17/04*    (2006.01)
(Continued)

(52) U.S. Cl.
CPC ............... *H05K 1/181* (2013.01); *H01F 1/22* (2013.01); *H01F 17/0013* (2013.01);
(Continued)

(58) Field of Classification Search
CPC .... H01F 1/147; H01F 27/2804; H01F 27/255; H01F 2027/2809; H05K 1/181; H05K 2201/1003; H05K 1/111
(Continued)

(56) References Cited

U.S. PATENT DOCUMENTS 5,173,670 A * 12/1992 Naito ....................... H01G 2/22
                                                    333/184
6,140,902 A * 10/2000 Yamasawa ............ H01F 10/187
                                                    336/200
(Continued)

FOREIGN PATENT DOCUMENTS

| CN | 102930947 A | 2/2013 |
| JP | 2007-27354  | 2/2007 |
| JP | 2013-55316  | 3/2013 |

OTHER PUBLICATIONS

Chinese Office Action dated Dec. 2, 2016, issued in Chinese Patent Application No. 201410283852.6. (w/ English translation).

*Primary Examiner* — Tsz Chan
*Assistant Examiner* — Kazi Hossain
(74) *Attorney, Agent, or Firm* — McDermott Will & Emery LLP

(57) ABSTRACT

A multilayer electronic component, a manufacturing method thereof, and a board having the same. The multilayer electronic component includes a plurality of magnetic metal layers, an internal conductive layer formed on the magnetic metal layer, an upper and lower cover layers formed on and below an active part including the plurality of magnetic metal layers and internal conductive layer. The multilayer electronic component may have excellent DC bias characteristics by using a magnetic metal material, implement low direction resistance (Rdc) by increasing a cross-sectional area of an internal coil, and secure high magnetic permeability while decreasing a core loss of the magnetic metal material to thereby improve efficiency characteristic.

16 Claims, 7 Drawing Sheets

(51) Int. Cl.
  *H01F 27/24*  (2006.01)
  *H05K 1/18*  (2006.01)
  *H01F 17/00*  (2006.01)
  *H01F 41/04*  (2006.01)
  *H01F 1/22*  (2006.01)
  *H01F 27/255*  (2006.01)

(52) U.S. Cl.
  CPC ......... *H01F 41/046* (2013.01); *H01F 27/255* (2013.01); *H01F 2017/0066* (2013.01)

(58) Field of Classification Search
  USPC ........................................ 336/200, 233, 234
  See application file for complete search history.

(56) References Cited

U.S. PATENT DOCUMENTS

| | | | |
|---|---|---|---|
| 8,525,630 | B2 | 9/2013 | Kobayashi et al. |
| 2009/0045905 | A1* | 2/2009 | Nakagawa ................ H01F 1/26 336/232 |
| 2010/0289609 | A1* | 11/2010 | Liao ........................ H01F 17/04 336/221 |
| 2011/0227690 | A1* | 9/2011 | Watanabe ................ C22C 38/00 336/221 |
| 2012/0188049 | A1* | 7/2012 | Matsuura .................. B22F 1/02 336/212 |
| 2012/0274438 | A1* | 11/2012 | Hachiya .............. H01F 17/0013 336/221 |
| 2013/0033347 | A1* | 2/2013 | Matsuura ............ H01F 17/0033 336/83 |
| 2013/0038419 | A1* | 2/2013 | Kobayashi .......... H01F 17/0013 336/200 |
| 2013/0082815 | A1* | 4/2013 | Ogawa ...................... H01F 3/08 336/233 |
| 2013/0127576 | A1* | 5/2013 | Hachiya ................ H01F 27/255 336/200 |
| 2014/0266543 | A1* | 9/2014 | Park .................... H01F 17/0013 336/200 |
| 2015/0022308 | A1* | 1/2015 | Moon ....................... B22F 1/02 336/221 |

* cited by examiner

"A"

"B"

MULTILAYER ELECTRONIC COMPONENT, MANUFACTURING METHOD THEREOF, AND BOARD HAVING THE SAME MOUNTED THEREON

CROSS-REFERENCE TO RELATED APPLICATIONS

This application claims foreign priority benefit of Korean Patent Application No. 10-2013-0147905 filed on Nov. 29, 2013, with the Korean Intellectual Property Office, the disclosure of which is incorporated herein by reference.

BACKGROUND

The present disclosure relates to a multilayer electronic component, a manufacturing method thereof, and a board having the same mounted thereon. Unless otherwise indicated herein, the materials described in this section are not prior art to the claims herein and are not admitted to be prior art by inclusion in this section.

Among electronic components, inductors, important passive devices configuring electronic circuits, together with resistors and capacitors, are used as components for removing noise, used as components configuring LC resonance circuits, and the like.

Passive devices such as power inductors, and the like, used in smartphones, portable communications devices, and the like, are used in a high frequency band of 1 MHz or more. Therefore, a soft magnetic material prepared by mixing, grinding and calcining a plurality of metal oxides, for example, soft magnetic ferrites, $Fe_2O_3$, NiO, CuO, ZnO, and the like, can be used.

However, as amounts of data transmitted by smartphones, portable communications devices, and the like, have significantly increased, Central Processing Unit (CPU) switching frequencies have also been increased to allow for high-speed data processing, and accordingly, power usage in mobile devices, and the like, has rapidly increased due to the implementation of large screen sizes and high degrees of resolution in portable communications devices and smartphone screens. Due to the increase in the power usage amount in mobile devices, as described above, passive devices such as power inductors, and the like, disposed within and used in plural in driving circuit designs for devices such as CPUs, display devices, power management modules, and the like, should have high power consumption efficiency characteristics.

In order to improve the efficiency of power inductors, or the like, a power inductor device capable of being used within a high frequency band of 1 MHz or more by replacing a soft magnetic ferrite material with a fine metal powder and of having improved energy consumption efficiency and direct current (DC) bias characteristics through significantly decreased eddy current loss therein, has been produced.

Japanese Patent Laid-Open Publication No. 2007-027354 appears to disclose a thin film inductor or a wound inductor in which a metal powder is used in the manufacturing of the inductor.

Such a thin film inductor may be manufactured through a process in which a coil shape is formed on a board such as a printed circuit board (PCB), or the like, using a plating method, a metal-epoxy mixed material obtained by mixing metal powder and an epoxy resin with each other is used to enclose the formed coil shape through press-molding, and the epoxy resin is cured in a heat treatment.

A wound inductor may be manufactured by winding a copper wire, enclosing the wound copper wire with a metal-epoxy mixed material obtained by mixing metal powder and an epoxy resin with each other, press-molding the enclosed copper wire in a mold at high pressure to implement a chip, and then curing the epoxy resin in a heat treatment.

Inductors manufactured using the methods as described above have significantly excellent DC bias characteristics as compared to ferrite multilayer inductors, and as a result, the efficiency of power management integrated circuit (PMIC) module sets, and the like, may be improved by an amount of several percent or more.

As described above, a magnetic metal multilayer inductor has been studied in order to simultaneously secure mass production, in addition to advantages in which DC bias characteristics and efficiency characteristics of the inductor, or the like, are improved due to the application of a soft metal powder. The magnetic metal multilayer inductor may be manufactured by forming a uniform mixture of metal powder and a polymer as a sheet instead of an oxide ferrite sheet, and performing a series of processes such as a cutting process, a via hole punching process, an internal conductor printing process, a stacking process, a sintering process, and the like, on the magnetic metal sheet.

In such a magnetic metal multilayer inductor, DC bias characteristics may be implemented on a level similar to that of the thin film inductor or the wound inductor, but a quality factor (Q) value affecting efficiency characteristics of the inductor is further required to increase, and direct current (DC) resistance (Rdc) is required to decrease.

As for efficiency characteristics, core loss of a magnetic material is dominant in a low current region, and an influence of resistance on an internal coil is dominant in a high current region. Particularly, in order to increase inductor efficiency in low current conditions, directly associated with standby power usage time, a magnetic material having low core loss of a magnetic metallic material and high magnetic permeability should be applied.

SUMMARY

Additional aspects and/or advantages will be set forth in part in the description which follows and, in part, will be apparent from the description, or may be learned by practice of the invention.

Embodiments of the present disclosure may provide a multilayer electronic component having excellent DC bias characteristics, improved core loss properties of a magnetic material used therein, and decreased DC resistance (Rdc) to thereby have improved efficiency, a manufacturing method thereof, and a board having the same mounted thereon.

According to an embodiment, a multilayer electronic component may include a plurality of magnetic metal layers, and an internal conductive layer formed on the magnetic metal layer. The internal conductive layer may include an internal coil pattern part and a negative printed part, and in a cross-section of the negative printed part, the amount of particles having a long-axis length of about 5 μm or less may be in a range of about 65% to about 70% of the overall amount of particles, and the amount of particles having a long-axis length of about 10 μm to about 20 μm may be in a range of about 8% to about 12% of the overall amount of particles.

In the cross-section of the negative printed part, the amount of particles having a long-axis length of about 3 μm or less may be in a range of about 35% to about 45% of the overall amount of particles.

In the cross-section of the negative printed part, the amount of particles having a long-axis length of about 10 μm to about 14 μm may be about 6% to about 8% of the overall amount of particles.

In a cross-section of the magnetic metal layer, the amount of particles having a long-axis length of about 4 μm to about 6 μm may be about 15% to about 30% of the overall amount of particles.

The magnetic metal layer and the negative printed part may contain the same magnetic metal material as each other.

The magnetic metal layer and the negative printed part may contain magnetic metal particles of an alloy containing one or more selected from a group consisting of iron (Fe), silicon (Si), chromium (Cr), aluminum (Al), and nickel (Ni).

An embodiment of the magnetic metal layer and the negative printed part may contain magnetic metal particles having a metal oxide film formed on surfaces thereof, and the metal oxide film is bound to metal oxide films of magnetic metal particles adjacent thereto.

An embodiment of the multilayer electronic component may further include upper and lower cover layers formed on and below an active part including the plurality of magnetic metal layers and internal conductive layers. In a cross-sections of each of the upper and lower cover layers, the amount of particles having a long-axis length of about 5 μm or less may be about 65% to about 70% of the overall amount of particles, and the amount of particles having a long-axis length of about 10 μm to about 20 μm may be about 8% to 12% of the overall amount of particles.

A thickness of the magnetic metal layer may be about 10 μm to about 30 μm.

An aspect ratio of a width to a thickness of the internal coil pattern part may be about 3.0 to about 12.0.

According to an embodiment, a multilayer electronic component may include a plurality of magnetic metal layers, and an internal conductive layer formed on the magnetic metal layer. The internal conductive layer may include an internal coil pattern part and a negative printed part, and in the negative printed part, a magnetic metal particle having a $D_{50}$ of about 4 μm to about 6 μm and a magnetic metal particle having a $D_{50}$ of about 8 μm to about 12 μm may be mixed with each other.

In the negative printed part, the magnetic metal particle having a $D_{50}$ of about 4 μm to about 6 μm and the magnetic metal particle having a $D_{50}$ of about 8 μm to about 12 μm may be mixed with each other at a weight ratio of about 10:90 to about 20:80.

The magnetic metal layer may contain the magnetic metal particle having a $D_{50}$ of about 4 μm to about 6 μm.

The multilayer electronic component may further include upper and lower cover layers formed on and below an active part including the plurality of magnetic metal layers and internal conductive layers. In the upper and lower cover layers, the magnetic metal particle having a $D_{50}$ of about 4 μm to about 6 μm and the magnetic metal particle having a $D_{50}$ of about 8 μm to about 12 μm may be mixed with each other.

In the upper and lower cover layers, the magnetic metal particle having a $D_{50}$ of about 4 μm to about 6 μm and the magnetic metal particle having a $D_{50}$ of about 8 μm to about 12 μm may be mixed with each other at a weight ratio of about 10:90 to about 20:80.

According to an embodiment, a board having a multilayer electronic component may include a printed circuit board having first and second electrode pads formed thereon, and the multilayer electronic component as described above mounted on the printed circuit board.

According to an embodiment, a manufacturing method of a multilayer electronic component may include preparing a plurality of magnetic metal sheets, forming an internal coil pattern part on the magnetic metal sheet, forming a negative printed part around the internal coil pattern part using a magnetic paste, and stacking and sintering a plurality of magnetic metal sheets on which the internal coil pattern part and the negative printed part are formed. In the magnetic paste, a magnetic metal particle having a $D_{50}$ of about 4 μm to about 6 μm and a magnetic metal particle having a $D_{50}$ of about 8 μm to about 12 μm may be mixed with each other.

In the magnetic paste, the magnetic metal particle having a $D_{50}$ of about 4 μm to about 6 μm and the magnetic metal particle having a $D_{50}$ of about 8 μm to about 12 μm may be mixed with each other at a mixing weight ratio of about 10:90 to about 20:80.

The magnetic metal sheet may contain the magnetic metal particle having a $D_{50}$ of about 4 μm to about 6 μm at a content of about 95 wt % or more.

The magnetic metal sheet and the magnetic paste may contain magnetic metal particles of an alloy containing one or more selected from a group consisting of Fe, Si, Cr, Al, and Ni.

A thickness of the magnetic metal sheet may be about 10 μm to about 30 μm.

An aspect ratio of a width to a thickness of the internal coil pattern part may be about 3.0 to about 12.0.

The internal coil pattern part may be formed after forming a primary negative printed part on the magnetic metal sheet, and the primary negative printed part may include a secondary negative printed part formed thereon.

The internal coil pattern part and the negative printed part may be formed to have the same thickness as each other.

The manufacturing method may further include forming upper and lower cover layers by additionally stacking a plurality of magnetic metal sheets on and below a multilayer body formed by stacking the plurality of magnetic metal sheets on which the internal coil pattern part and the negative printed part are formed. In the magnetic metal sheet forming the upper and lower cover layers, the magnetic metal particle having a $D_{50}$ of about 4 μm to about 6 μm and the magnetic metal particle having a $D_{50}$ of about 8 μm to about 12 μm may be mixed with each other at a mixing weight ratio of about 10:90 to about 20:80.

BRIEF DESCRIPTION OF THE DRAWINGS

The above and other aspects, features and other advantages will be more clearly understood from the following detailed description taken in conjunction with the accompanying drawings, in which:

FIGS. 6A through 6C are views for schematically describing a manufacturing method of a multilayer electronic component according to an embodiment of;

DETAILED DESCRIPTION

Figure 1:
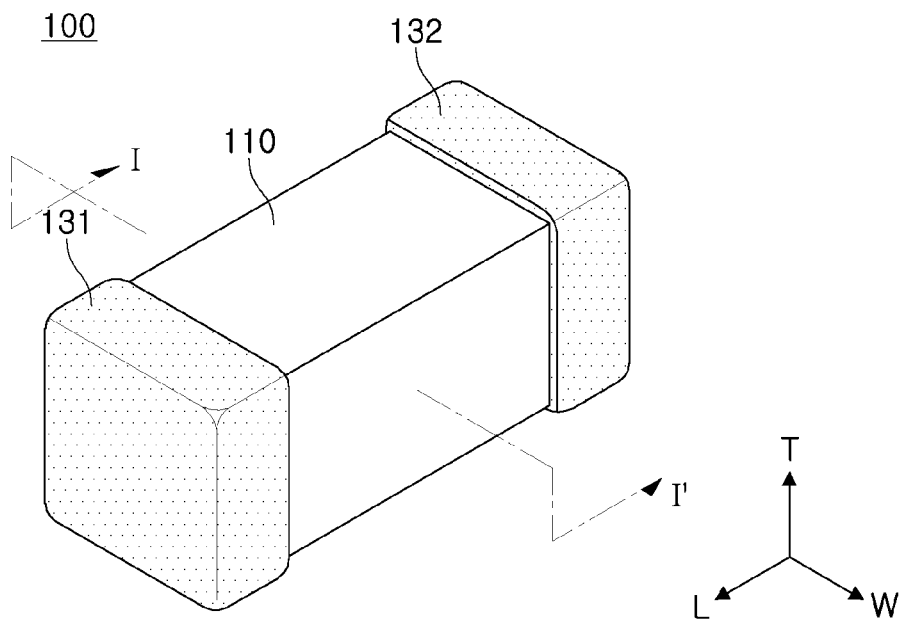
FIG. 1 is a perspective view of a multilayer electronic component according to an embodiment.

Hereinafter, embodiments will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

Hereinafter, the multilayer electronic component according to an embodiment will be described. In detail, a multilayer inductor will be described, but the present disclosure is not limited thereto.

Figure 2:
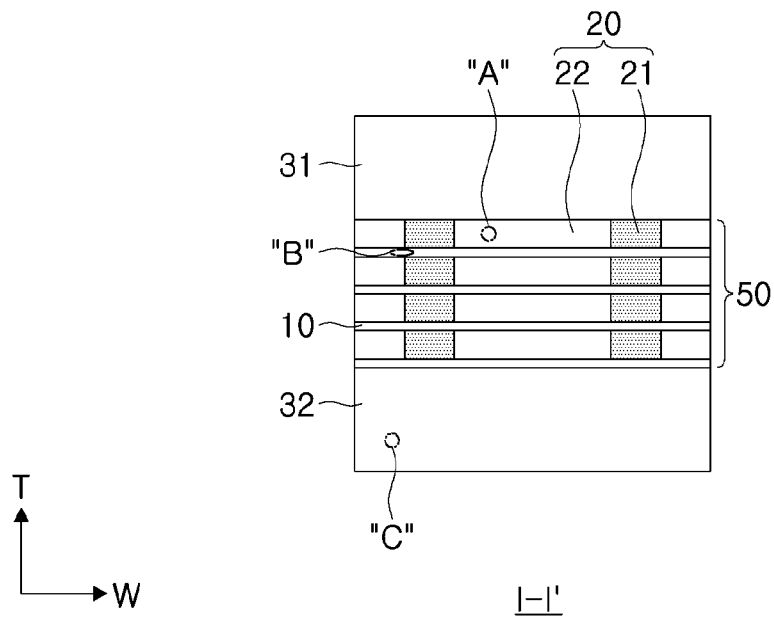
FIG. 2 is a cross-sectional view taken along line I-I' of FIG. 1.

FIG. 1 is a perspective view of a multilayer electronic component according to an embodiment, and FIG. 2 is a cross-sectional view taken along line I-I' of FIG. 1.

Referring to FIGS. 1 and 2, the multilayer electronic component 100 according to an embodiment may include a plurality of magnetic metal layers 10 and an internal conductive layer 20 formed on the magnetic metal layer 10.

The plurality of magnetic metal layers 10 on which the internal conductive layer 20 is formed may be stacked to form an active part 50 contributing to inductance formation, and upper and lower cover layers 31 and 32 may be formed on and below the active part 50, respectively. A magnetic metal body 110 including the active part 50 and the upper and lower cover layers 31 and 32 may be formed as a rectangular prism having end surfaces in a length (L) direction, side surfaces in a width (W) direction, and top and bottom surfaces in a thickness (T) direction.

First and second external electrodes 131 and 132, electrically connected to an internal coil, may be formed on both end surfaces of the magnetic metal body 110.

The magnetic metal layer 10 may have a thickness of about 30 μm or less. As the magnetic metal layer 10 has a thin thickness of about 30 μm or less, there may be an advantage in terms of securing a magnetic path in a chip, and a total length of the internal coil may be decreased. In further detail, the magnetic metal layer 10 may have a thickness of about 10 μm to about 30 μm.

The magnetic metal layer 10 may contain magnetic metal particles.

The magnetic metal particle may contain magnetic metal particles of a soft magnetic alloy, for example, an alloy containing one or more selected from a group consisting of Fe, Si, Cr, Al, and Ni. In further detail, the magnetic metal particles may include a Fe—Si—Cr based alloy, but are not limited thereto.

The internal conductive layer 20 formed on the magnetic metal layer 10 may include an internal coil pattern part 21 and a negative printed part 22.

The internal coil pattern part 21 may be formed so that an aspect ratio of a width to a thickness is in a range of about 3.0 to about 12.0. Direct current resistance (Rdc) may be decreased by increasing the thickness of the internal coil pattern part 21 so as to satisfy the above-mentioned aspect ratio in the range of about 3.0 to about 12.0.

In the case in which the aspect ratio of the internal coil pattern part 21 is less than 3.0, direct current resistance (Rdc) may be increased, such that efficiency may be decreased. In the case in which the aspect ratio is more than 12.0, a flow path of a magnetic field generated by current applied to the chip may be narrowed, such that inductance (H) may be decreased.

Such an aspect ratio of the internal coil pattern part 21 may be changed according to a chip size and inductance. For example, the internal coil pattern part 21 may be formed to have an aspect ratio of about 3.0 to about 7.0 and a thickness of about 40 μm to about 85 μm (See, for example, Tables 1 and 2 below).

The internal coil pattern part 21 may be formed by printing a conductive paste containing a conductive metal, and the conductive metal is not particularly limited, as long as the metal has excellent electric conductivity. For example, as the conductive metal, silver (Ag), palladium (Pd), aluminum (Al), nickel (Ni), titanium (Ti), gold (Au), copper (Cu), platinum (Pt), or the like, may be used alone, or in a mixture thereof.

In the case of increasing the thickness of the internal coil pattern part 21 in order to decrease direct current resistance (Rdc), a stacking step may be generated due to the thickness of the internal coil pattern part 21. Thus, the internal coil pattern part 21 may be depressed or deformed during a pressing process of a multilayer body due to this stacking step, and problems such as a slit between layers due to a decrease in adhesion between the layers, cracks, or the like, may be generated.

Therefore, the negative printed part 22 may be formed on the remaining portion of the internal conductive layer 20, except for a region thereof in which the internal coil pattern part 21 is formed.

The negative printed part 22 may be formed to have the same thickness as that of the internal coil pattern part 21, such that the problems due to generation of the stacking step may be solved.

The negative printed part 22 may be formed by printing a magnetic paste containing magnetic metal particles, and the magnetic metal particles may contain magnetic metal particles of soft magnetic alloy, for example, an alloy containing one or more selected from a group consisting of Fe, Si, Cr, Al, and Ni. In further detail, the magnetic metal particles may be formed of a Fe—Si—Cr based alloy, but are not limited thereto.

The negative printed part 22 may contain the same magnetic metal particle as that of the magnetic metal layer 10.

The upper and lower cover layers 31 and 32 formed on and below the active part 50 contributing to inductance formation may be formed by stacking a plurality of magnetic metal sheets.

The plurality of magnetic metal sheets configuring the upper and lower cover layers 31 and 32 may be in a sintered state. Adjacent magnetic metal layers may be integrated so as to be difficult to confirm a boundary therebetween without using a scanning electron microscope (SEM).

The upper and lower cover layers 31 and 32 may contain the same magnetic metal particle as that of the negative printed part 22 and the magnetic metal layer 10.

Figure 3:
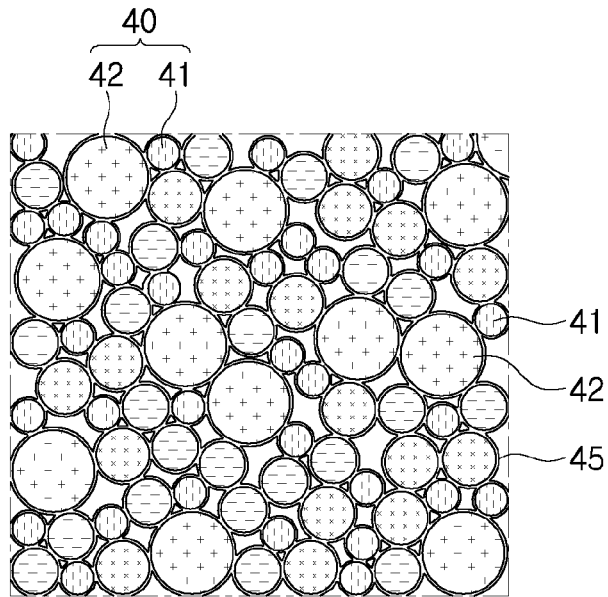
FIG. 3 is a partially enlarged view schematically illustrating part A of FIG. 2.
Figure 4:
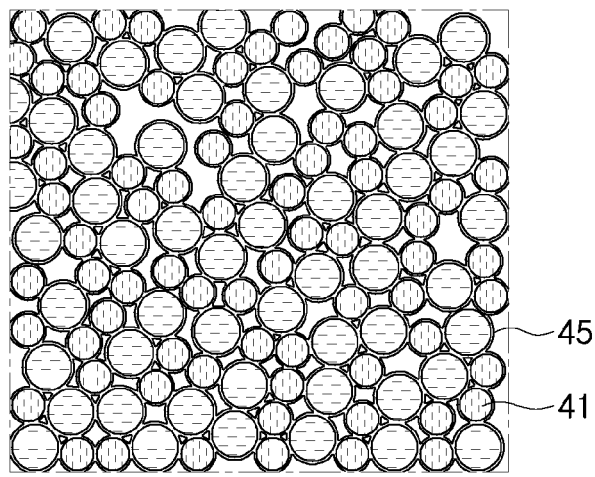
FIG. 4 is a partially enlarged view schematically illustrating part B of FIG. 2.
Figure 5:
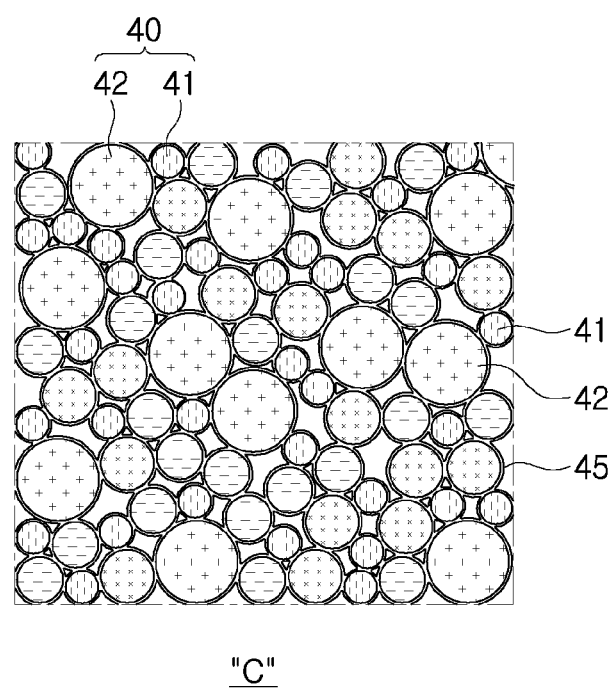
FIG. 5 is a partially enlarged view schematically illustrating part C of FIG. 2.

FIG. 3 is a partially enlarged view schematically illustrating part A of the negative printed part 22 of FIG. 2, FIG. 4 is a partially enlarged view schematically illustrating part B of the magnetic metal layer 10 of FIG. 2, and FIG. 5 is a partially enlarged view schematically illustrating part C of the lower cover layer 32 of FIG. 2.

Referring to FIGS. 3 through 5, a metal oxide film 45 may be formed on surfaces of magnetic metal particles 40 forming the magnetic metal layer 10, the negative printed part 22, and the upper and lower cover layers 31 and 32, and insulation properties between the metal particles and between the metal particles and an internal electrode may be secured by the metal oxide film 45.

The metal oxide film 45 may be formed by oxidation of at least one ingredient of the magnetic metal particle 40, and for example, may contain $Cr_2O_3$.

The metal oxide film 45 may be bound to the metal oxide film 45 of magnetic metal particles 40 adjacent thereto, and the magnetic metal particles 40 may be bound to each other by binding strength between the metal oxide films 45. Mechanical strength and the insulation property may be improved by the binding between the metal oxide films 45.

Meanwhile, the negative printed part 22 may include a mixture of a magnetic metal particle 41 having a $D_{50}$ of about 4 μm to about 6 μm and a magnetic metal particle 42 having a $D_{50}$ of about 8 μm to about 12 μm. $D_{50}$ may indicate a particle diameter at a volume based cumulative percentage of 50% which is measured through a particle size distribution measuring method using laser diffraction and scattering.

In the case of using a magnetic metal particle having a relatively large particle size, magnetic permeability may be relatively high, but a core loss may be increased. However, in the case of using a mixture of fine magnetic metal particles 41 and coarse magnetic metal particles 42 having different particle size distribution from each other, the magnetic permeability may be significantly improved by decreasing the particle size of the magnetic metal particle to decrease the core loss and improve a filling ratio, to offset a decrease in magnetic permeability due to a decrease in the particle size.

The magnetic metal particle 41 ($D_{50}$: about 4 μm to about 6 μm) and the magnetic metal particle 42 ($D_{50}$: about 8 μm to about 12 μm) may be mixed at a weight ratio of about 10:90 to about 20:80.

When the fine magnetic metal particle 41 and the coarse magnetic metal particle 42 are mixed with each other at the weight ratio of, as described above, about 10:90 to about 20:80 with respect to the magnetic metal particle 41 to the magnetic metal particle 42, the filling ratio may be significantly improved, such that magnetic permeability may be relatively high, and Q characteristics may be excellent (See, for example, Table 3 below).

In the case of observing a cross-section of the negative printed part 22 in which the fine magnetic metal particle 41 and the coarse magnetic metal particle 42 are mixed with each other, the amount of particles having a long-axis length of about 5 μm or less may be about 65% to about 70% of the overall amount of observed and measured particles, and the amount of particles having a long-axis length of about 10 μm to about 20 μm may be about 8% to about 12% of the overall amount of particles.

The observation results were obtained as follows. A width (W)-thickness (T) surface of a chip of which the sintering was completed was processed using an ion beam cross-section polisher (CP, model name: SM-09010), such that a cross-section of the magnetic metal body was exposed. SEM photographs obtained by photographing the processed cross-sections of 4 sintered chips were analyzed. SEM photographs (photographed at a 5,000× magnification) of the negative printed part 22 and the upper and lower cover layers 31 and 32 were analyzed, and SEM photographs (at an 8,000× magnification) of the magnetic metal layer 10 were analyzed. A size of the particle was measured from the SEM photograph based on a scale bar on the SEM photograph using an image analysis program.

In such a case of measuring the particle size, sizes of particles caught by a SEM photograph frame to thereby be partially cut, particles not clearly distinguishable as single particles, particles not subjected to the cross section polishing (CP) process, or the like, were not measured, and a particle size was measured based on a longest axis of a cross-section of an individual particle of which the cross-section is entirely exposed by the CP process.

Among the measured particle size data, particle size data exceeding 20 μm were removed as abnormal data, and with respect to the remaining measured particle size data of about 20 μm or less, the amount of particles having each of the particle sizes was divided by the overall amount of measured particles to thereby be expressed as a percentage.

In the case of observing a cross-section of the negative printed part 22, the amount of particles having a long-axis length of about 3 μm or less may be about 35% to about 45% of the overall amount of particles and the amount of particles having a long-axis length of about 10 μm to about 14 μm may be about 6% to about 8% of the overall amount of particles.

The magnetic metal layer 10 on which the internal conductive layer 20 is formed may contain the magnetic metal particle 41 having a $D_{50}$ of about 4 μm to about 6 μm.

In the case in which the $D_{50}$ of the magnetic metal particle forming the magnetic metal layer 10 is less than 4 μm, magnetic permeability may be decreased due to a decrease in particle size. In the case of applying a coarse magnetic metal particle having a $D_{50}$ more than 6 μm, dispersibility may be decreased, a surface roughness of the magnetic metal sheet may be increased, and strength may be decreased due to an increase in pores in the magnetic metal layer, such that it may be difficult to form the magnetic metal layer 10 so as to have a thickness of 30 μm or less (See, for example, Table 4 below).

In the case of observing a cross-section of the magnetic metal layer 10, the amount of particles having a long-axis length of about 4 μm to about 6 μm may be about 15% to about 30% of the overall amount of particles.

Further, in order to increase the filling ratio to improve magnetic permeability, the upper and lower cover layers 31 and 32 formed on and below the active part 50 may include a mixture in which the magnetic metal particle 41 ($D_{50}$: about 4 μm to about 6 μm) and the magnetic metal particle 42 ($D_{50}$: about 8 μm to about 12 μm) are mixed at a weight ratio of about 10:90 to about 20:80.

When the fine magnetic metal particle 41 and the coarse magnetic metal particle 42 are mixed with each other at the weight ratio of about 10:90 to about 20:80, the filling ratio may be significantly improved, such that magnetic permeability may be relatively high, and the Q characteristics may be excellent.

In the case of observing cross-sections of the upper and lower cover layers 31 and 32 in which the fine magnetic metal particle 41 and the coarse magnetic metal particle 42 are mixed with each other at the weight ratio of about 10:90 to about 20:80, the amount of particles having a long-axis length of about 5 μm or less may be about 65% to about 70% of the overall amount of particles, and the amount of particles having a long-axis length of about 10 μm to about 20 μm may be about 8% to about 12% of the overall amount of particles.

The following Table 1 shows results obtained by evaluating relationships between direct current resistance (Rdc) according to the turns of the internal coil, the width and the thickness of the internal electrode and inductance.

The results of the following Table 1 were obtained from the evaluation performed under conditions at which a chip size (L*W*T) was 2.00×1.60×0.90 [mm], an interval between magnetic layers was 15[μm], magnetic permeability was 35, desired inductance (Ls) was 0.470 (0.423~0.564) [uH], and maximum direct current resistance (Rdc) was 35[mOhm].

TABLE 1

| Turns of Internal coil | Width W (μm) | Thickness T (μm) | W/T Ratio | W * T (mm$^2$) | Rdc (mOhm) | Inductance Ls (uH) |
|---|---|---|---|---|---|---|
| 4.5 | 310 | 60 | 5.2 | 0.0186 | 33 | 0.443 |
| 4.5 | 320 | 55 | 5.8 | 0.0176 | 35 | 0.460 |
| 4.5 | 330 | 55 | 6.0 | 0.0182 | 34 | 0.449 |
| 4.5 | 340 | 55 | 6.2 | 0.0187 | 32 | 0.439 |
| 4.5 | 350 | 50 | 7.0 | 0.0175 | 34 | 0.456 |
| 5.5 | 310 | 70 | 4.4 | 0.0217 | 35 | 0.505 |
| 5.5 | 320 | 70 | 4.6 | 0.0224 | 34 | 0.493 |
| 5.5 | 330 | 65 | 5.1 | 0.0215 | 35 | 0.514 |
| 5.5 | 340 | 65 | 5.2 | 0.0221 | 33 | 0.501 |
| 5.5 | 350 | 60 | 5.8 | 0.0210 | 35 | 0.522 |
| 6.5 | 310 | 85 | 3.6 | 0.0264 | 34 | 0.465 |
| 6.5 | 320 | 80 | 4.0 | 0.0256 | 35 | 0.498 |
| 6.5 | 330 | 80 | 4.1 | 0.0264 | 33 | 0.486 |
| 6.5 | 340 | 75 | 4.5 | 0.0255 | 34 | 0.516 |
| 6.5 | 350 | 75 | 4.7 | 0.0263 | 33 | 0.503 |
| 7.5 | 360 | 80 | 4.5 | 0.0288 | 34 | 0.451 |
| 7.5 | 370 | 80 | 4.6 | 0.0296 | 33 | 0.439 |
| 7.5 | 380 | 75 | 5.1 | 0.0285 | 34 | 0.494 |
| 7.5 | 380 | 80 | 4.8 | 0.0304 | 32 | 0.427 |
| 7.5 | 390 | 75 | 5.2 | 0.0293 | 33 | 0.480 |

The results of the following Table 2 were evaluated under conditions at which a chip size (L*W*T) was 1.60×0.83× 0.80 [mm], an interval between magnetic layers was 15[μm], magnetic permeability was 26, desired inductance (Ls) was 0.160 (0.1440.192) [uH], and maximum direct current resistance (Rdc) was 80[mOhm].

TABLE 2

| Turns of Internal coil | Width W(μm) | Thickness T(μm) | W/T Ratio | Rdc (mOhm) | Inductance Ls (uH) |
|---|---|---|---|---|---|
| 4.5 | 133 | 43 | 3.1 | 82 | 0.249 |
| 4.5 | 160 | 43 | 3.7 | 63 | 0.221 |
| 3.5 | 144 | 44 | 3.3 | 57 | 0.176 |
| 3.5 | 163 | 44 | 3.7 | 47 | 0.165 |
| 3.5 | 140 | 44 | 3.2 | 59 | 0.173 |
| 3.5 | 160 | 44 | 3.6 | 48 | 0.157 |

As shown in the Tables 1 and 2 above, in order to satisfy the desired inductance and direct current resistance (Rdc), a W/T ratio of an internal coil pattern part may be about 3.0 to 7.0. In this case, the required thickness of the internal conductor coil part has a maximum threshold of about 85 μm. In order to achieve such a relatively large thickness, the negative printed part may be formed around the internal coil pattern part. The W/T ratio of the internal coil pattern part may be changed within a range of about 3.0 to about 12.0 according to chip size and inductance.

The following Table 3 shows results obtained by measuring density after sintering in the air, Q characteristics, and the like, of a toroidal core shaped body according to the mixing weight ratio of magnetic metal particles ($D_{50}$:5 μm) and magnetic metal particles ($D_{50}$: 10 μm).

TABLE 3

| $D_{50}$ 5 μm (wt %) | $D_{50}$ 10 μm (wt %) | density (g/cc) | metal vol % | Q (1 MHz) | Q (6 MHz) | Magnetic Permeability (μ) |
|---|---|---|---|---|---|---|
| 0.0 | 100.0 | 5.30 | 70.0 | 80.6 | 55.4 | 39.3 |
| 6.5 | 93.5 | 5.54 | 73.2 | 69.7 | 32.2 | 38.6 |
| 10.0 | 90.0 | 5.37 | 71.0 | 79 | 57.3 | 40.6 |
| 13.0 | 87.0 | 5.28 | 69.7 | 77.6 | 52.6 | 40.8 |
| 15.0 | 85.0 | 5.35 | 70.8 | 78.6 | 57.9 | 38.6 |
| 18.0 | 82.0 | 5.35 | 70.7 | 79 | 53.5 | 40.3 |
| 20.0 | 80.0 | 5.41 | 71.5 | 81.7 | 63.5 | 39.6 |
| 30.0 | 70.0 | 5.12 | 67.7 | 73 | 49.5 | 37.7 |
| 40.0 | 60.0 | 5.07 | 67.0 | 70.9 | 54.0 | 39.5 |
| 100.0 | 0.0 | 5.17 | 68.3 | 94.7 | 98.1 | 31.9 |

As shown in the Table 3 above, in the case in which the magnetic metal particles ($D_{50}$: 5 μm) and the magnetic metal particles ($D_{50}$: 10 μm) were mixed with each other at a mixing weight ratio of about 10:90 to about 20:80, the density and the Q characteristics at a high frequency may be excellent. In further detail, the magnetic metal particles ($D_{50}$: 5 μm) and the magnetic metal particles ($D_{50}$: 10 μm) may be mixed with each other at a mixing weight ratio of about 20:80.

The following Table 4 shows results of film density according to the composition of the magnetic metal particles of the magnetic metal sheet.

TABLE 4

| Metal Composition | Metal (wt %) | Organic Material (wt %) | Organic Material | Film Density (g/cc) |
|---|---|---|---|---|
| $D_{50}$ 5 μm alone | 95.8 | 4.2 | PVB | 4.48 |
| $D_{50}$ 5 μm:10 μm (2:8 (weight ratio)) | 96.6 | 3.4 | PVB | 3.98 |

As shown in the Table 4, in the case of applying the magnetic metal particles ($D_{50}$:5 μm) alone, the filling ratio of the magnetic metal particle was improved, and the film density was significantly increased. Thus, strength of the magnetic metal layer having a thickness of 30 μm or less could be secured.

Figure 6A:
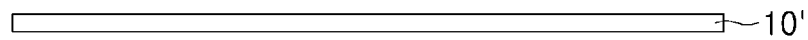
Figure 6B:
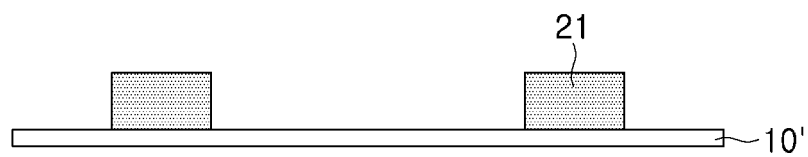
Figure 6C:
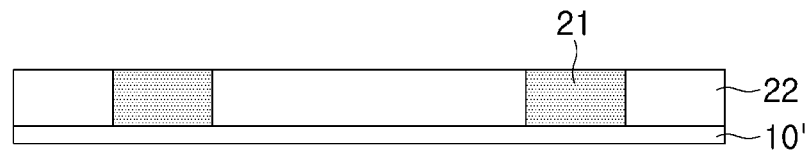
Figure 7A:
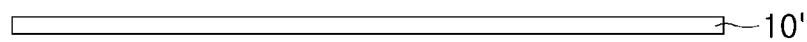
FIGS. 7A through 7D are views for schematically describing a manufacturing method of a multilayer electronic component according to an embodiment.
Figure 7B:
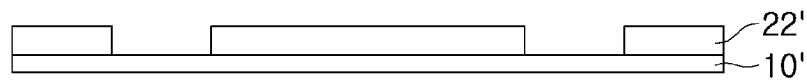
Figure 7C:
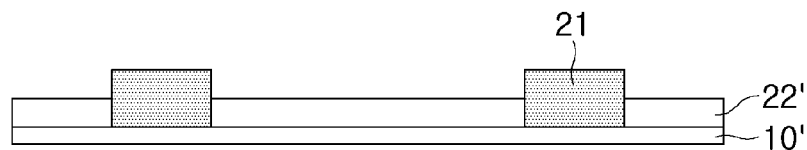
Figure 7D:
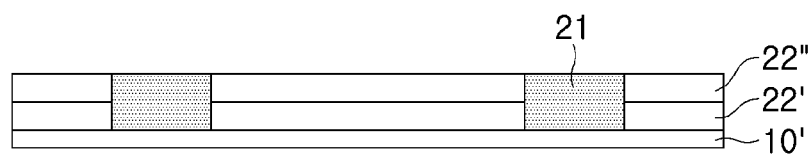

FIGS. 6A through 6C are views schematically describing a manufacturing method of a multilayer electronic component according to an embodiment.

Referring to FIG. 6A, first, a plurality of magnetic metal sheets 10' may be prepared.

The magnetic metal sheet 10' may be manufactured in a sheet shape by mixing magnetic metal particles and organic materials such as a binder, a solvent, and the like to prepare slurry, applying the slurry onto a carrier film at a thickness of several tens of μm using a doctor blade method, and then drying the applied slurry.

The magnetic metal sheet 10' may be formed to have a thickness of about 30 μm or less. As the magnetic metal sheet 10' has a thin thickness of about 30 μm or less, there may be an advantage in terms of securing a magnetic path in a chip, and a total length of an internal coil may be decreased. In further detail, the magnetic metal sheet 10' may have a thickness of about 10 μm to about 30 μm.

The magnetic metal particle may contain a soft magnetic alloy, for example, an alloy containing one or more selected from a group consisting of Fe, Si, Cr, Al, and Ni, and in further detail, a Fe—Si—Cr based alloy, but is not limited thereto.

The magnetic metal particles may be formed to have $D_{50}$ of about 4 μm to about 6 μm.

In the case in which the $D_{50}$ of the magnetic metal particle forming the magnetic metal sheet 10' is less than 4 μm, magnetic permeability may be decreased due to a decrease in the particle size. In the case of applying a coarse magnetic metal particle having a $D_{50}$ more than 6 μm, high frequency Q characteristics and dispersibility of the metal particles may be decreased, a surface roughness of the magnetic metal sheet may be increased, and chip strength may be decreased due to an increase in pores in the magnetic metal layer, in which it may be difficult to form the magnetic metal sheet 10' so as to have a thickness of about 30 μm or less.

In order to improve film density of the magnetic metal sheet 10', a content of the organic material may be about 5.0 wt % or less, and the magnetic metal particles having $D_{50}$ of about 4 μm to 6 μm may be contained at a content of about 95 wt % or more.

Referring to FIG. 6B, an internal coil pattern part 21 may be formed on the magnetic metal sheet 10'.

The internal coil pattern part 21 may be formed by applying a conductive paste containing a conductive metal using a printing method, or the like. The conductive metal is not particularly limited as long as it has excellent electrical conductivity. For example, as the conductive metal, silver (Ag), palladium (Pd), aluminum (Al), nickel (Ni), titanium (Ti), gold (Au), copper (Cu), platinum (Pt), or the like, may be used alone, or in a mixture thereof. As the printing method of the conductive paste, a screen printing method, a gravure printing method, or the like, may be used, but the present disclosure is not limited thereto.

The internal coil pattern part 21 may be formed to have an aspect ratio of a width to a thickness, being within a range of about 3.0 to abpit 12.0. Direct current resistance (Rdc) may be decreased by increasing the thickness of the internal coil pattern part 21 so as to satisfy the aspect ratio of about 3.0 to about 12.0 as described above.

In the case in which the aspect ratio of the internal coil pattern part 21 is less than 3.0, direct current resistance (Rdc) may be increased, such that efficiency may be decreased. In the case in which the aspect ratio is more than 12.0, a flow path of a magnetic field generated by current applied to the chip may become relatively narrow, such that inductance (H) may be decreased.

The aspect ratio of the internal coil pattern part 21 may be changed according to a chip size and inductance. For example, the internal coil pattern part 21 may be formed to have an aspect ratio of about 3.0 to about 7.0 and a thickness of about 40 μm to about 85 μm.

Referring to FIG. 6C, a negative printed part 22 may be formed around the internal coil pattern part 21 using a magnetic paste.

The negative printed part 22 is formed around the internal coil pattern part 21 so as to prevent a stacking step due to the thickness of the internal coil pattern part 21 from being generated. In detail, the negative printed part 22 may be formed to have the same thickness as that of the internal coil pattern part 21.

The magnetic paste may contain magnetic metal particles and an organic material such as a binder, and the like.

The magnetic metal particle may contain magnetic metal particles of soft magnetic alloy, for example, an alloy containing one or more selected from a group consisting of Fe, Si, Cr, Al, and Ni. In further detail, the magnetic metal particles may be a Fe—Si—Cr based alloy, but are not limited thereto.

The magnetic paste forming the negative printed part 22 may contain the same kind of magnetic metal particle as that of the magnetic metal sheet 10'.

The magnetic paste may contain a magnetic metal particle ($D_{50}$: about 4 μm to about 6 μm) and a magnetic metal particle ($D_{50}$: about 8 μm to about 12 μm) at a mixing weight ratio of about 10:90 to about 20:80.

In the case of using a magnetic metal particle having a relatively large particle size, magnetic permeability may be relatively high, but core loss may be increased. However, in the case of using a mixture of fine magnetic metal particles and coarse magnetic metal particles having different particle size distribution from each other, the magnetic permeability may be significantly improved by decreasing the particle size of the magnetic metal particle to decrease the core loss and improve a filling ratio, and thus, a decrease in magnetic permeability due to a decrease in the particle size may be offset.

When the fine magnetic metal particle and the coarse magnetic metal particle are mixed with each other at the mixing weight ratio of about 10:90 to about 20:80 as described above, the filling ratio may be significantly improved, such that magnetic permeability may be relatively high, and the Q characteristics may be excellent.

The magnetic paste may be applied by a screen printing method, or the like, and heated and dried, thereby forming the negative printed part 22.

FIG. 7 is a view for schematically describing a manufacturing method of a multilayer electronic component according to an embodiment in order to form an internal conductive layer 20.

Referring to FIG. 7, first, after forming a primary negative printed part 22' on a magnetic metal sheet 10', an internal coil pattern part 21 may be formed.

As the internal coil pattern part 21 is printed after the primary negative printed part 22' is formed, the internal coil pattern part 21 may be formed to have a thicker thickness, such that direct current resistance (Rdc) may be decreased.

After forming the internal coil pattern part 21, a secondary negative printed part 22" may be further formed on the primary negative printed part 22', such that the internal coil pattern part 21 and the negative printed part 22 may have the same thickness as each other.

Figure 8:
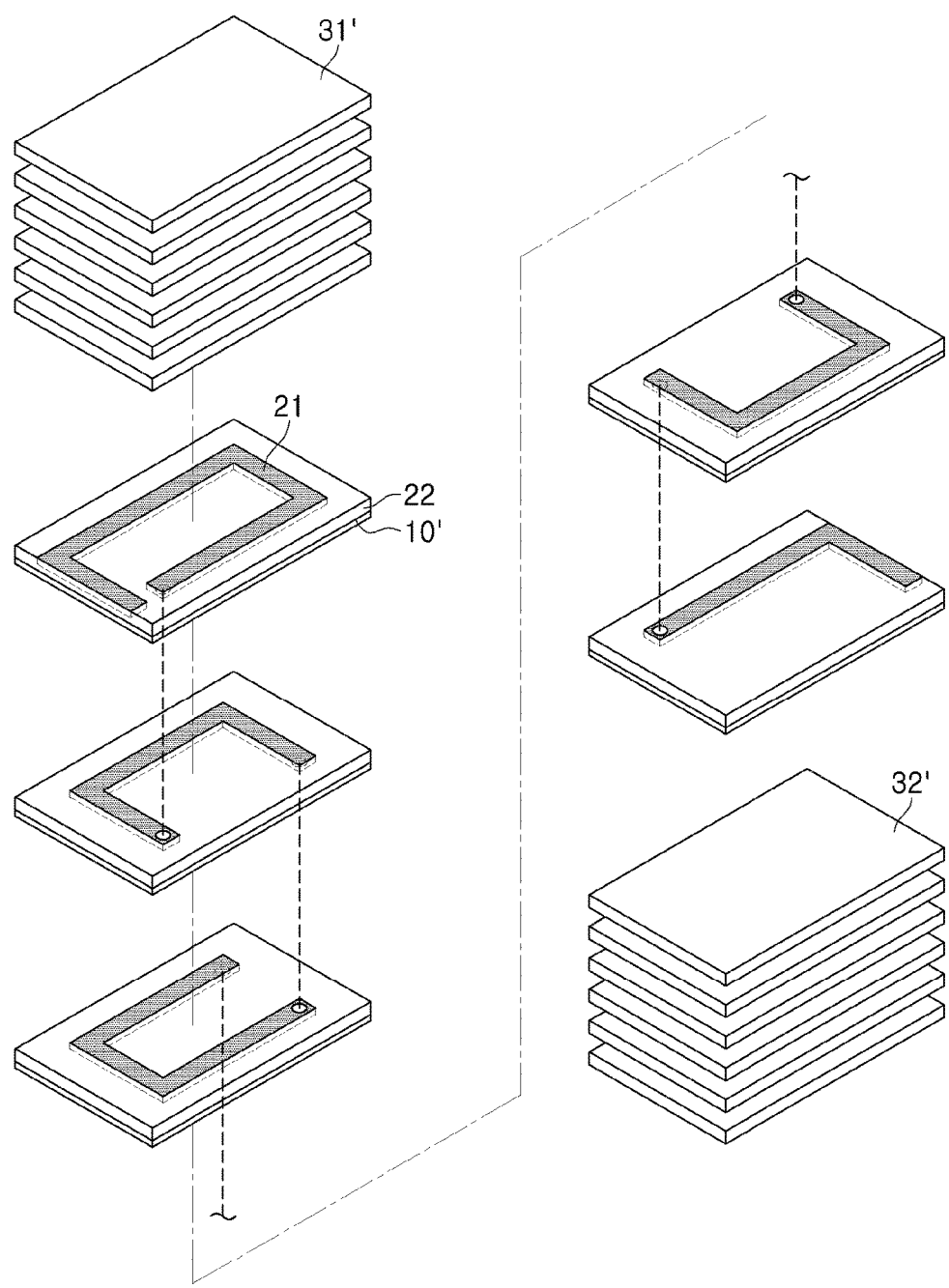
FIG. 8 is an exploded perspective view of a multilayer electronic component according to an embodiment.

FIG. 8 is an exploded perspective view of a multilayer electronic component according to an embodiment.

Referring to FIG. 8, an active part 50 may be formed by stacking the magnetic metal sheets 10' on which the internal conductive layer 20 is formed, and upper and lower cover layers 31 and 32 may be formed by additionally stacking a plurality of magnetic metal sheets 31' and 32' on and below the active part 50.

The magnetic metal sheets 31' and 32' forming the upper and lower cover layers 31 and 32 may contain a magnetic metal particle ($D_{50}$: about 4 μm to about 6 μm) and a magnetic metal particle ($D_{50}$: about 8 μm to about 12 μm) at a mixing weight ratio of about 10:90 to about 20:80.

When the fine magnetic metal particle and the coarse magnetic metal particle are mixed with each other at the above-mentioned weight ratio of about 10:90 to about 20:80, the filling ratio may be significantly improved, such that magnetic permeability may be relatively high, and the Q characteristics may be excellent.

The active part 50 is formed by stacking the magnetic metal sheet 10' on which the internal conductive layer 20 is formed, and the magnetic metal sheets 31' and 32' on which the internal conductive layer 20 is not formed are stacked on and below the active part 50, followed by pressing and sintering, thereby forming a magnetic metal body.

Thereafter, first and second external electrodes 131 and 132 may be formed on both end surfaces of the magnetic metal body by applying a conductive paste and sintering the applied conductive paste. The external electrodes 131 and 132 may be formed to contain copper (Cu), silver (Ag), nickel (Ni), or the like, or to contain a mixture thereof, and a tin (Sn) or nickel (Ni) plating layer may be formed on the external electrode.

Figure 9:
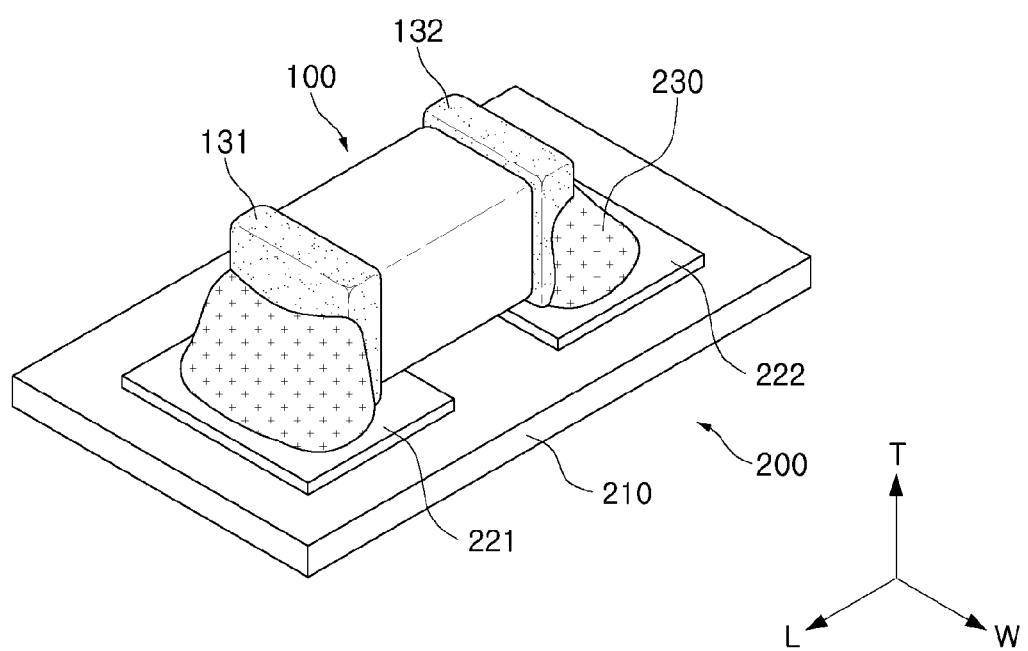
FIG. 9 is a perspective view illustrating a form in which the multilayer electronic component of FIG. 1 is mounted on a printed circuit board.

FIG. 9 is a perspective view illustrating a form in which the multilayer electronic component of FIG. 1 is mounted on a printed circuit board.

Referring to FIG. 9, a board 200 having a multilayer electronic component 100 according to an embodiment may include a printed circuit board 210 on which the multilayer electronic component 100 is horizontally mounted and first and second electrode pads 221 and 222 formed on the printed circuit board 210 to be spaced apart from each other.

In this case, the multilayer electronic component 100 may be electrically connected to the printed circuit board 210 by soldering 230 in a state in which first and second external electrodes 131 and 132 are positioned on the first and second electrode pads 221 and 222 so as to contact each other, respectively.

A description of features overlapped with those of the multilayer electronic component according to the foregoing embodiments will be omitted.

According to an embodiment, the multilayer electronic component may have excellent DC bias characteristics by using a magnetic metal material, implement low direct current resistance (Rdc) by increasing a cross-sectional area of the internal coil, and secure high magnetic permeability while decreasing the core loss of the magnetic metal material, thereby improving the efficiency characteristics.

While embodiments have been shown and described above, it will be apparent to those skilled in the art that modifications and variations could be made without departing from the spirit and scope of the present disclosure as defined by the appended claims.

What is claimed is:

1. A multilayer electronic component comprising:
a plurality of magnetic metal layers; and
an internal conductive layer disposed on the magnetic metal layer,
wherein the internal conductive layer includes an internal coil pattern part and a negative printed part, in a cross-section of the negative printed part, a number of particles having a long-axis length of about 5 μm or less being about 65% to 70% of an overall number of particles, and a number of particles having a long-axis length of about 10 μm to about 20 μm being about 8% to about 12% of the overall number of particles.

2. The multilayer electronic component of claim 1, wherein in the cross-section of the negative printed part, a number of particles having a long-axis length of 3 μm or less is in a range of about 35% to about 45% of the overall number of particles.

3. The multilayer electronic component of claim 1, wherein in the cross-section of the negative printed part, a number of particles having a long-axis length of about 10 μm to 14 μm is about 6% to about 8% of the overall number of particles.

4. The multilayer electronic component of claim 1, wherein in a cross-section of the magnetic metal layer, a number of particles having a long-axis length of about 4 μm to about 6 μm is about 15% to 30% of the overall number of particles.

5. The multilayer electronic component of claim 1, wherein the magnetic metal layer and the negative printed part contain the same magnetic metal material as each other.

6. The multilayer electronic component of claim 1, wherein the magnetic metal layer and the negative printed part contain magnetic metal particles of an alloy containing one or more selected from a group consisting of iron (Fe), silicon (Si), chromium (Cr), aluminum (Al), and nickel (Ni).

7. The multilayer electronic component of claim 1, wherein the magnetic metal layer and the negative printed part contain magnetic metal particles having a metal oxide film formed on surfaces of the magnetic metal particles, the metal oxide film being bound to metal oxide films of magnetic metal particles adjacent thereto.

8. The multilayer electronic component of claim 1, further comprising upper and lower cover layers formed on and below an active part including the plurality of magnetic metal layers and internal conductive layers,
wherein in a cross-section of each of the upper and lower cover layers, the number of particles having a long-axis length of about 5 μm or less is in a range of about 65% to about 70% of the overall number of particles, and the number of particles having a long-axis length of about 10 μm to about 20 μm is in a range of about 8% to about 12% of the overall number of particles.

9. The multilayer electronic component of claim 1, wherein a thickness of the magnetic metal layer is about 10 μm to about 30 μm.

10. The multilayer electronic component of claim 1, wherein an aspect ratio of a width to a thickness of the internal coil pattern part is about 3.0 to 12.0.

11. A multilayer electronic component comprising:
a plurality of magnetic metal layers; and
a plurality of internal coil pattern parts and a plurality of negative printed parts respectively disposed on the plurality of magnetic metal layers,
wherein
in the plurality of negative printed parts, a magnetic metal particle having a $D_{50}$ of about 4 μm to about 6 μm and a magnetic metal particle having a $D_{50}$ of about 8 μm to about 12 μm are mixed with each other at a weight ratio of about 10:90 to about 20:80, and
the plurality of magnetic metal layers do not contain the magnetic metal particle having a $D_{50}$ of about 8 μm to about 12 μm.

12. The multilayer electronic component of claim 11, wherein the magnetic metal layer contains the magnetic metal particle having a $D_{50}$ of about 4 μm to about 6 μm.

13. The multilayer electronic component of claim 11, further comprising upper and lower cover layers formed on and below an active part including the plurality of magnetic metal layers, the plurality of internal coil pattern parts, and the plurality of negative printed parts,
wherein in the upper and lower cover layers, the magnetic metal particle having a $D_{50}$ of about 4 μm to about 6 μm and the magnetic metal particle having a $D_{50}$ of about 8 μm to about 12 μm are mixed with each other.

14. The multilayer electronic component of claim 13, wherein in the upper and lower cover layers, the magnetic metal particle having a $D_{50}$ of about 4 μm to about 6 μm and the magnetic metal particle having a $D_{50}$ of about 8 μm to about 12 μm are mixed with each other at a weight ratio of about 10:90 to about 20:80.

15. A board having a multilayer electronic component, comprising:
   a printed circuit board having first and second electrode pads formed on the printed circuit board; and
   the multilayer electronic component of claim 1 mounted on the printed circuit board.

16. A board having a multilayer electronic component, comprising:
   a printed circuit board having first and second electrode pads formed on the printed circuit board; and
   the multilayer electronic component of claim 11 mounted on the printed circuit board.

* * * * *